United States Patent
Qu

(10) Patent No.: US 9,436,030 B2
(45) Date of Patent: Sep. 6, 2016

(54) MOTHER SUBSTRATE FOR DISPLAY SUBSTRATES, DISPLAY PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Lianjie Qu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 57 days.

(21) Appl. No.: 14/528,295

(22) Filed: Oct. 30, 2014

(65) Prior Publication Data
US 2015/0331274 A1    Nov. 19, 2015

(30) Foreign Application Priority Data
May 16, 2014    (CN) ................ 2014 2 0252626 U

(51) Int. Cl.
| | | |
|---|---|---|
| *B32B 3/02* | (2006.01) | |
| *G02F 1/1333* | (2006.01) | |
| *H01L 27/12* | (2006.01) | |

(52) U.S. Cl.
CPC ..... *G02F 1/133351* (2013.01); *H01L 27/1214* (2013.01); *Y10T 428/24802* (2015.01)

(58) Field of Classification Search
CPC .............. H01L 2251/566; H01L 51/5256; H01L 27/1262; G02F 1/13338; G02F 1/133351; G02F 1/133371; Y10T 428/10; Y10T 428/24802
See application file for complete search history.

(56) References Cited

U.S. PATENT DOCUMENTS

| | | | | |
|---|---|---|---|---|
| 2008/0158482 A1* | 7/2008 | Jang | ............... | C03B 33/033 349/73 |
| 2012/0154720 A1* | 6/2012 | Park | ............... | G02F 1/1339 349/104 |

* cited by examiner

*Primary Examiner* — Elizabeth Mulvaney
(74) *Attorney, Agent, or Firm* — Nath, Goldberg & Meyer; Joshua B. Goldberg; Tanya E. Harkins

(57) ABSTRACT

The embodiments of the present invention provide a mother substrate for display substrates, a display panel and a display device. The mother substrate for display substrates includes a plurality of display substrates and is divided into a display substrate area and a non display substrate area, and at least one film layer of the mother substrate for display substrates has an identical film layer structure in the display substrate area and the non display substrate area. With such arrangement, the arrangement of the at least one film layer is more uniform inside the mother substrate for display substrates, thereby the difference between the stresses applied to the display substrate area and the non display substrate area of the mother substrate for the display substrates by the at least one film layer is reduced significantly.

6 Claims, 1 Drawing Sheet

MOTHER SUBSTRATE FOR DISPLAY SUBSTRATES, DISPLAY PANEL AND DISPLAY DEVICE

FIELD OF THE INVENTION

The present invention relates to the technical field of display technology, and in particularly, relates to a mother substrate for display substrates, a display panel and a display device.

BACKGROUND OF THE INVENTION

Thin film transistor liquid crystal display (TFT-LCD) includes an array substrate and a color filter substrate. In the manufacturing processes of the TFT-LCD, alignment in vacuum is the core process in cell forming. Here, as shown in FIG. 1, generally, when manufacturing the array substrate, a plurality of array substrates are formed simultaneously on a mother substrate for array substrates through a plurality of patterning processes. Similarly, a plurality of color filter substrates are formed simultaneously on a mother substrate for color filter substrates. The cell forming is referred to a process in which the mother substrate for array substrates and the mother substrate for color filter substrates are aligned to form a cell in an approximate vacuum environment.

As shown in FIG. 1, the mother substrate for array substrates includes a plurality of array substrates, and correspondingly, the mother substrate for array substrates may be divided into an array substrate area 3 and a non array substrate area 4. All the structures which are necessary for the array substrates are formed within the array substrate area 3, and specifically include structures such as respective film layer structures of a thin film transistor, gate lines, data lines, pixel electrodes and driving circuit arranged at the edge of the array substrate area.

Generally, when manufacturing a film layer of the array substrate, a whole layer of material is deposited on the mother substrate for array substrates. Then, in the array substrate area 3, the whole layer of material is etched to remove a part of the material layer, so that the remaining material forms the required pattern of the film layer. After etching, the structure of the film layer remaining in the array substrate area 3 is determined by the above pattern of the film layer. In the non array substrate area 4, generally, the material layer remains completely or is removed completely by etching. Therefore, in respect of the array substrate area 3 and the non array substrate area 4, the stresses applied to the different areas of the mother substrate for array substrates by the material layer are identical after depositing the material layer and before etching the material layer, and after the material layer is etched to form the film layer, due to the difference of the structures remaining on the array substrate area 3 and the non array substrate area 4, the stresses applied to the above two areas of the mother substrate for array substrates by the film layer are different, that is, a stress difference is formed.

The applicant has found that at least the following issues exist in the prior art: for a mother substrate for array substrates, a stress difference exists between the array substrate area 3 and the non array substrate area 4, this stress difference will lead to a deviation of alignment when aligning the mother substrate for array substrates, and furthermore, it will lead to a phenomenon of color bias on the display panel when displaying.

SUMMARY OF THE INVENTION

An object of the present invention is to provide a mother substrate for display substrates, a display panel and a display device. By enabling at least one film layer of the mother substrate for display substrates to have an identical film layer structure in a display substrate area and a non display substrate area, the difference between the stresses applied to the display substrate area and the non display substrate area of the mother substrate for the display substrates by the at least one film layer is reduced significantly, and furthermore, a deviation of alignment of the mother substrate for display substrates during cell forming due to the difference between stresses applied to the different areas by the at least one film layer is reduced significantly, thus a color bias due to the deviation of alignment is reduced significantly.

The embodiments of the present invention provide a mother substrate for display substrates, the mother substrate for display substrates includes a plurality of display substrates, and is divided into a display substrate area and a non display substrate area, and at least one film layer of the mother substrate for display substrates has an identical film layer structure in the display substrate area and the non display substrate area.

Preferably, the mother substrate for display substrates is a mother substrate for array substrates.

Preferably, a data line layer of the mother substrate for array substrates has an identical film layer structure in the display substrate area and the non display substrate area.

Preferably, a pixel layer of the mother substrate for array substrates has an identical film layer structure in the display substrate area and the non display substrate area.

Preferably, a gate line layer of the mother substrate for array substrates has an identical film layer structure in the display substrate area and the non display substrate area.

Preferably, the mother substrate for display substrates is a mother substrate for color filter substrates.

Preferably, a common electrode layer of the mother substrate for color filter substrates has an identical film layer structure in the display substrate area and the non display substrate area.

The embodiments of the present invention also provide a display panel including a display substrate formed by cutting the above mother substrate for display substrates.

The embodiments of the present invention also provide a display device including the above display panel.

Preferably, the above display device is a liquid crystal display device.

The beneficial effects of the present invention: according to the mother substrate for display substrates provided by the embodiments of the present invention, by enabling at least one film layer of the mother substrate for display substrates to have an identical film layer structure in the display substrate area and the non display substrate area, the arrangement of the at least one film layer is more uniform inside the mother substrate for display substrates, the non-uniformity of the at least one film layer in the display substrate area and non display substrate area of the mother substrate for display substrates is reduced, thereby the difference between the stresses applied to the display substrate area and the non display substrate area of the mother substrate for the display substrates by the at least one film layer is reduced significantly, and furthermore, a deviation of alignment of the mother substrate for display substrates during cell forming due to the difference between stresses applied to the different areas by the at least one film layer is reduced significantly, thus the color bias due to the deviation of alignment is reduced significantly.

According to the display panel and the display device provided by the embodiments of the present invention, by using the display substrate which is formed by cutting the mother substrate for display substrates, the display panel can be formed by aligning two display substrates precisely, thereby the occurrence of the color bias issue can be reduced significantly, thus the display quality of the display panel is improved. According to the display device provided by the embodiments of the present invention, the display quality of the display device can be improved by using the above display panel.

Figure 1:
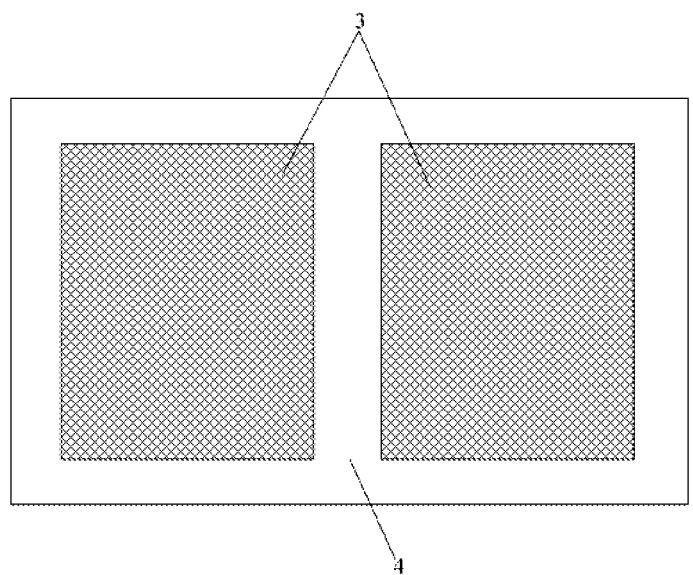
FIG. 1 is a top view of a structure of a mother substrate for array substrates in the prior art.

REFERENCE NUMERALS 1. display substrate area; 2. non display substrate area; 3. array substrate area; 4. non array substrate area.

DETAILED DESCRIPTION OF THE EMBODIMENTS

In order to enable the person skilled in the art to better understand the technical solutions of the present invention, a mother substrate for display substrates, a display panel and a display device will be described in more details in conjunction with the accompanying drawings and the specific implementations.

Embodiment 1

Figure 2:
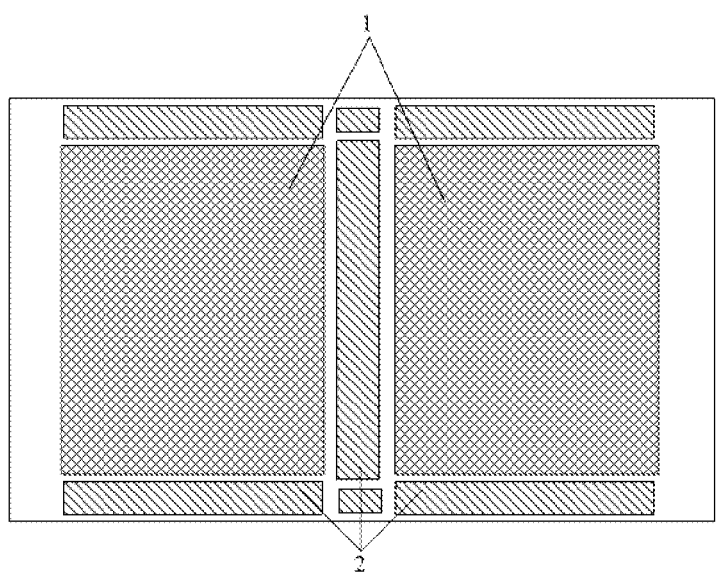
FIG. 2 is a top view of a structure of a mother substrate for display substrates according to an embodiment of the present invention.

The present embodiment provides a mother substrate for display substrates, which, as shown in FIG. 2, includes a plurality of display substrates, the mother substrate for display substrates is divided into a display substrate area 1 and a non display substrate area 2, and at least one film layer of the mother substrate for display substrates is arranged to have an identical film layer structure in the display substrate area 1 and the non display substrate area 2.

With such arrangement, the arrangement of the at least one film layer is more uniform inside the mother substrate for display substrates, the non-uniformity of the at least one film layer in the display substrate area 1 and the non display substrate area 2 of the mother substrate for display substrates is reduced, thereby the difference between the stresses applied to the display substrate area 1 and the non display substrate area 2 of the mother substrate for display substrates by the at least one film layer is reduced significantly, and furthermore, a deviation of alignment of the mother substrate for display substrates during cell forming due to the difference between stresses applied to the different areas by the at least one film layer is reduced significantly, thus the color bias due to the deviation of alignment is reduced significantly.

Specifically, an example that the mother substrate for display substrates is a mother substrate for array substrates is taken for explanation. According to the present invention, a data line layer of the mother substrate for array substrates has an identical film layer structure in the display substrate area 1 and the non display substrate area 2. A pixel layer of the mother substrate for array substrates has an identical film layer structure in the display substrate area 1 and the non display substrate area 2. And a gate line layer of the mother substrate for array substrates has an identical film layer structure in the display substrate area 1 and the non display substrate area 2.

Generally, the data line layer, the pixel layer and the gate line layer inside the mother substrate for array substrates are made of a conductive material or a conductive metal oxide material, according to the arrangement in the prior art, after the conductive material or the conductive metal oxide material is formed within the display substrate area 1 of the mother substrate for array substrates, a relatively high stress may be applied to the display substrate area 1 of the mother substrate for array substrates, and a relatively low stress may be applied to the non display substrate area 2 of the mother substrate for array substrates. Compared to the prior art, in the present embodiment, by arranging the film layer structure(s) of any one or more of the data line layer, the pixel layer and the gate line layer to be identical in the display substrate area 1 and the non display substrate area 2, the arrangement of the corresponding film layer(s) is more uniform in the display substrate area 1 and non display substrate area 2 of the mother substrate for array substrates, thereby the difference between the stresses applied to the display substrate area 1 and the non display substrate area 2 of the mother substrate for array substrates by the corresponding film layer(s) is reduced significantly, and furthermore, a deviation of alignment of the mother substrate for array substrates during cell forming due to the difference between stresses applied to the different areas by the corresponding film layer(s) is reduced significantly, thus the color bias due to the deviation of alignment is reduced significantly.

Wherein, the term "identical film layer structure" means that for a film layer, the patterns in the two areas are identical. For example, for a gate line layer, its pattern in the display substrate area 1 is a plurality of gate lines, and correspondingly, its pattern in the non display substrate area 2 is also a plurality of "gate lines". Of course, the "gate lines" in the non display substrate area 2 only have the same pattern as the gate lines in the display substrate area 1, and will be removed in the final product, thus these "gate lines" in the non display substrate area 2s do not act as the gate lines actually.

It should be noted that in order to ensure that the stresses in the display substrate area 1 and the non display substrate area 2 of the mother substrate for array substrates are identical, the other film layers (such as an active layer, a source-drain layer, a gate insulation layer, a passivation layer and a driving circuit layer) inside the mother substrate for array substrates may be selectively arranged to have an identical film layer structure, in addition to the above film layers inside the mother substrate for array substrates, such that the difference between stresses applied to the display substrate area 1 and the non display substrate area 2 of the mother substrate for array substrates by these film layers can be further reduced, and a deviation of alignment of the mother substrate for array substrates during cell forming due to the difference between stresses applied to the different areas by these film layers is further reduced, thus the color bias due to the deviation of alignment is further reduced.

Embodiment 2

The present embodiment provides a mother substrate for display substrates, which differs from the mother substrate for display substrates of Embodiment 1 in that the mother substrate for display substrates is a mother substrate for color filter substrates.

Here, a common electrode layer of the mother substrate for color filter substrates has an identical film layer structure in the display substrate area and the non display substrate area. Generally, since the common electrode layer is made of a conductive metal oxide material, according to the arrangement in the prior art, this common electrode layer may apply a relatively high stress to the display substrate area of the mother substrate for color filter substrates, and apply a relatively low stress to the non display substrate area of the mother substrate for color filter substrates. Accordingly, the arrangement of the present embodiment can enable the arrangement of the common electrode layer to be more uniform in the display substrate area and the non display substrate area of the mother substrate for color filter substrates, thereby the difference between stresses applied to the display substrate area and the non display substrate area of the mother substrate for color filter substrates by the common electrode layer can be significantly reduced, and a deviation of alignment of the mother substrate for color filter substrates during cell forming due to the difference between stresses applied to the different areas by the common electrode layer is significantly reduced, thus a color bias due to the deviation of alignment is significantly reduced.

It should be noted that in order to ensure that the stresses in the display substrate area and the non display substrate area of the mother substrate for color filter substrates are identical, the other film layers (such as a color filter layer, a black matrix layer, and an insulation layer) inside the mother substrate for color filter substrates may be selectively arranged to have an identical film layer structure, in addition to the above film layer inside the mother substrate for color filter substrates, such that the difference between stresses applied to the display substrate area and the non display substrate area of the mother substrate for color filter substrates by these film layers can be further reduced, and a deviation of alignment of the mother substrate for color filter substrates during cell forming due to the difference between stresses applied to the different areas by these film layers is further reduced, thus the color bias due to the deviation of alignment is further reduced.

The beneficial effects of Embodiments 1 and 2: according to the mother substrates for display substrates provided by Embodiments 1 and 2, by enabling at least one film layer of the mother substrate for display substrates to have an identical film layer structure in the display substrate area and the non display substrate area, the arrangement of the at least one film layer is more uniform inside the mother substrate for display substrates, that is, the non-uniformity of the at least one film layer in the display substrate area and non display substrate area of the mother substrate for display substrates is reduced, thereby the difference between the stresses applied to the display substrate area and the non display substrate area of the mother substrate for the display substrates by the at least one film layer is reduced significantly, and furthermore, a deviation of alignment of the mother substrate for display substrates during cell forming due to the difference between stresses applied to the different areas by the at least one film layer is reduced significantly, thus the color bias due to the deviation of alignment is reduced significantly.

Embodiment 3

The present embodiment provides a display panel including a display substrate formed by cutting the mother substrate for display substrates according to Embodiment 1 or 2.

With the display substrate which is formed by cutting the mother substrate for display substrates according to Embodiment 1 or 2, the display panel may be formed by aligning two display substrates precisely, thereby the occurrence of the color bias issue can be reduced significantly, and thus the display quality of the display panel is improved.

Embodiment 4

The present embodiment provides a display device including the display panel according to Embodiment 3. In the present embodiment, the display device is preferably a liquid crystal display device.

It should be noted that the display device includes, but not limited to, any product or part that has a display function, such as a liquid crystal panel, an electronic paper, an OLED panel, a mobile phone, a tablet, a television, a display, a laptop computer, a digital frame, a navigator, or the like.

With the display panel according to Embodiment 3, the display quality of the display device can be improved.

It should be understood that, the above implementations are only exemplary embodiments for the purpose of explaining the principle of the present invention, and the present invention is not limited thereto. For a person skilled in the art, various improvements and modifications may be made to the present invention without departing from the spirit and essence of the present invention. These improvements and modifications are also deemed as the protection scope of the present invention.

What is claimed is:

1. A mother substrate for display substrates, including a plurality of display substrates, the mother substrate for display substrates being divided into a display substrate area and a non display substrate area, wherein, at least one film layer of the mother substrate for display substrates has an identical film layer structure in the display substrate area and the non display substrate area wherein, the mother substrate for display substrates is a mother substrate for array substrates; and wherein, a pixel layer of the mother substrate for array substrates has an identical film layer structure in the display substrate area and the non display substrate area.

2. The mother substrate for display substrates according to claim 1, wherein, a data line layer of the mother substrate for array substrates has an identical film layer structure in the display substrate area and the non display substrate area.

3. The mother substrate for display substrates according to claim 1, wherein, a gate line layer of the mother substrate for array substrates has an identical film layer structure in the display substrate area and the non display substrate area.

4. A display panel, including a display substrate formed by cutting the mother substrate for display substrates according to claim 1.

5. A display device, including the display panel according to claim 4.

6. The display device according to claim 5, wherein, the display device is a liquid crystal display device.

* * * * *